United States Patent
Ainsworth

[19]

[11] Patent Number: 5,994,959
[45] Date of Patent: Nov. 30, 1999

[54] LINEARIZED AMPLIFIER CORE

[75] Inventor: Walter William Ainsworth, Beaverton, Oreg.

[73] Assignee: Maxim Integrated Products, Inc., Sunnyvale, Calif.

[21] Appl. No.: 09/216,057

[22] Filed: Dec. 18, 1998

[51] Int. Cl.[6] ............................... H03F 3/45; H03F 3/04
[52] U.S. Cl. ........................................ 330/252; 330/310
[58] Field of Search ................................ 330/252, 295, 330/310

[56] References Cited

U.S. PATENT DOCUMENTS

| | | | |
|---|---|---|---|
| 4,550,291 | 10/1985 | Millaway et al. | 330/277 |
| 4,818,896 | 4/1989 | Cavanna | 307/362 |
| 4,904,952 | 2/1990 | Tanimoto | 330/252 |
| 5,453,718 | 9/1995 | Kurokawa et al. | 330/252 |
| 5,561,392 | 10/1996 | Kimura | 327/350 |
| 5,572,165 | 11/1996 | Madni | 330/252 |
| 5,677,646 | 10/1997 | Entrikin | 330/295 |

*Primary Examiner*—Robert Pascal
*Assistant Examiner*—Patricia T. Nguyen
*Attorney, Agent, or Firm*—Blakely, Sokoloff, Taylor & Zafman LLP

[57] ABSTRACT

A circuit for linearizing the input/output characteristics of a differential amplifier core circuit is described. The differential amplifier core circuit comprises an input stage, a buffer stage, and an output stage. The input stage includes input transistors connected in a common emitter configuration, where the bases of the input transistors are coupled to input terminals. The input stage further includes load circuits coupled between the input transistors and a power supply terminal. The output stage includes output transistors connected in a common emitter configuration, where the output terminals are coupled to the collectors of the output transistors. First and second resistors are coupled between the collectors of the respective output transistors and the power supply terminal. The buffer stage includes a buffer circuit that is coupled between the input and output stages. The buffer circuit includes a pair of first transistors, each having a base coupled to a collector of the corresponding input transistor, a collector coupled to a power supply terminal, and an emitter coupled to the base of the corresponding output transistor. The buffer circuit further includes a pair of second transistors connected in a common emitter configuration, each having a base coupled to the input terminal, and a collector coupled to the emitter of the corresponding first transistor. A differential current in the first transistors is equal to a differential current in the output transistors, thereby canceling any non-linearity introduced by the output stage.

29 Claims, 3 Drawing Sheets

LINEARIZED AMPLIFIER CORE

BACKGROUND OF THE INVENTION

1. Field of the Invention

The present invention relates generally to analog circuits, and more specifically, to a circuit for linearizing the output of a differential amplifier core.

2. Background Information

FIG. 1 illustrates a circuit diagram of a prior art differential pair amplifier circuit. The differential amplifier circuit includes transistors Q1 and Q2, emitter degeneration resistors $R_{E1}$ and $R_{E2}$, load resistors $R_{C1}$ and $R_{C2}$, and a current source I. Differential inputs $V_{i+}$ and $V_{i-}$ are applied to the bases of transistors Q1 and Q2, and the differential outputs $V_{o+}$ and $V_{o-}$ are provided at the collectors of the transistors Q1 and Q2, respectively. The currents $I_{E1}$ and $I_{E2}$ through resistors $R_{E1}$ and $R_{E2}$, respectively, are:

$$I_{E1}=((V_{i+}-VBE_1)-V_E)/R_{E1}, \text{ and}$$

$$I_{E2}=((V_{i-}-VBE_2)-V_E)/R_{E2},$$

where
  $VBE_1$ is the base-emitter voltage of Q1 and $VBE_2$ is the base-emitter voltage of Q2.

In common mode, where $V_{i+}=V_{i-}$, the circuit is balanced such that half of the current I flows through Q1 ($I_{E1}$) and half of the current flows through Q2 ($I_{E2}$). In the differential mode, where $V_{i+}$ and $V_{i-}$ differ, the amplifier circuit of FIG. 1 becomes non-linear, since $VBE_1$ and $VBE_2$ vary with current in a non-linear manner. The base-emitter voltage difference ($VBE_1-VBE_2$) of transistors Q1 and Q2 is related to the ratio of collector currents by the expression:

$$\Delta VBE=(KT/q)*ln(I_{C1}/I_{C2}),$$

where
  K=Boltzmann's constant
  T=absolute temperature
  q=electron charge.

With an input $V_{i+}-V_{i-}$, the voltage $V_{E1}-V_{E2}$ across degeneration resistors $R_{E1}$ and $R_{E2}$ is:

$$V_{E1}-V_{E2}=(V_{i+}-VBE_1)-(V_{i-}-VBE_2), \text{ or}$$

$$V_{E1}-V_{E2}=(V_{i+}-V_{i-})-\Delta VBE.$$

With $R_{E1}=R_{E2}=R_E$, and $R_{C1}=R_{C2}=R_C$, the output $V_{o+}-V_{o-}$ is:

$$V_{O+}-V_{O-}=-\frac{R_C}{R_E}((V_{i+}-V_{i-})-\Delta VBE).$$

Thus, because the signal across the degeneration resistors $R_{E1}$ and $R_{E2}$ is not $V_{i+}-V_{i-}$, but $((V_{i+}-V_{i-})-\Delta VBE)$, the output is non-linear with respect to $(V_{i+}-V_{i-})$.

FIG. 2 illustrates a prior art technique for linearizing the characteristics of the differential amplifier circuit of FIG. 1. As shown, diode-connected transistors Q3 and Q4 are placed in the load circuits between the positive power supply terminal VCC and the load resistors $R_{C1}$ and $R_{C2}$, respectively. Assuming $R_{E1}=R_{C1}=R_{E2}=R_{C2}$ (i.e., a gain of 1), the effect of the diode-connected transistors Q2 and Q4 is to offset the non-linearity caused by the differential input transistors Q1 and Q2. Thus, as $V_{i+}=V_{i-}$ changes, the current change in $R_{C1}$ and associated VBE change in Q3 is the same as the current change in $R_{E1}$ and VBE change in Q1, thereby canceling the non-linearity in the output voltage. This technique is referred to as diode-linearization.

The diode-linearization technique shown in FIG. 2 has drawbacks. If a gain of X (i.e., $R_C=X*R_E$) is desired, where "X" is a positive whole number greater than 1, then X diode-connected transistors are required in the load. This adds to the number of VBEs in the circuit and reduces the headroom on the output (i.e., reducing the output voltage swing). Accordingly, there is a need in the technology for a method and apparatus to linearize the characteristics of such a differential amplifier.

SUMMARY OF THE INVENTION

The present invention comprises a circuit for linearizing the input/output characteristics of a differential amplifier core circuit having input terminals and output terminals. In one embodiment, the circuit includes an input stage, a buffer stage, and an output stage. The input stage includes input transistors connected in a common emitter configuration and coupled to the input terminals. The input stage further includes load circuits coupled between a power supply terminal and the input transistors. The input stage provides linear input/output characteristics. The output stage includes output transistors connected in a common emitter configuration, where the output terminals are coupled to the output transistors. The output stage provides non-linear input/output characteristics. The buffer stage is coupled between the input and output stages, and introduces a non-linearity equal and opposite to the non-linearity of the output stage. Consequently, the transfer curve from the input terminals to the output terminals is linear.

DETAILED DESCRIPTION

The present invention comprises a circuit for linearizing the input/output characteristics of a differential amplifier core circuit. The differential amplifier core circuit comprises an input stage, a buffer stage, and an output stage. The input stage includes a pair of input transistors connected in a common emitter configuration, where the bases of the input transistors are coupled to input terminals. The input stage further includes load circuits, each including a diode-connected transistor and a series resistor coupled between the collector of the corresponding input transistor and a first power supply terminal. The input stage provides linear input to output characteristics. The output stage includes a pair of output transistors connected in a common emitter configuration, where the output terminals are coupled to the collectors of the output transistors. A pair of resistors are coupled between the collectors of the respective output transistors and the first power supply terminal. The output stage introduces non-linearity to the output signal with respect to its input signal.

To cancel out the non-linearity introduced by the output stage, the buffer stage is coupled between the input and output stages. The buffer stage includes a pair of first transistors, each having a base coupled to a collector of the corresponding input transistor, a collector coupled to the power supply terminal, and an emitter coupled to the base of the corresponding output transistor. The buffer stage further includes a pair of second transistors connected in a common emitter configuration, each having a base coupled to the corresponding input terminal, a collector coupled to the emitter of the corresponding first transistor, and an emitter coupled to a common terminal through a respective resistor of a pair of resistors.

The differential current in the pair of first transistors of the buffer stage is made equal to the differential current in the pair of output transistors, thereby canceling any non-linearity introduced by the output stage. Consequently, a ΔVBE change of the buffer stage, responsive to a change in the input signal, offsets the ΔVBE change of the output stage.

Figure 3:
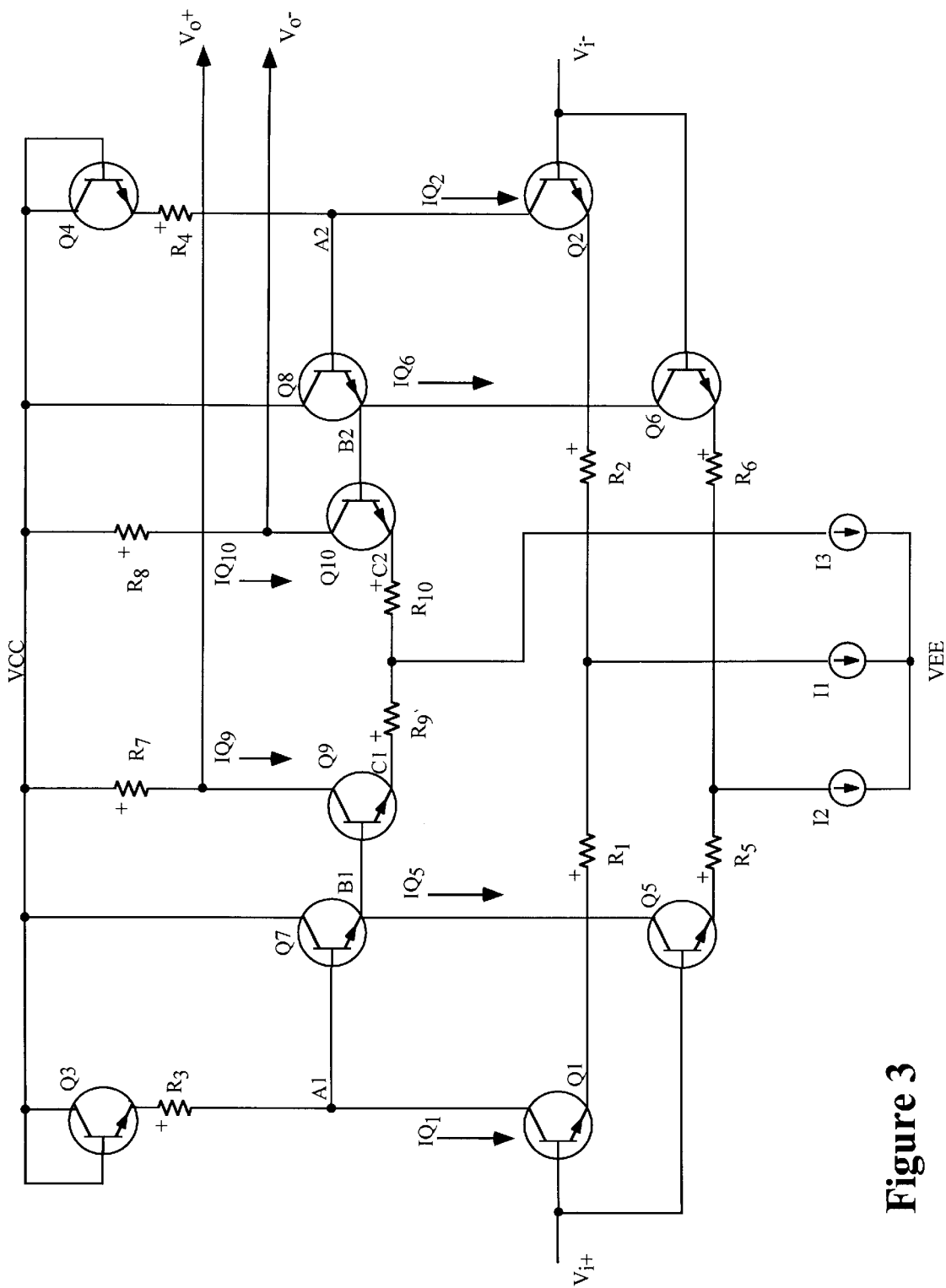
FIG. 3 illustrates a circuit diagram of a differential amplifier core circuit according to one embodiment of the present invention.

FIG. 3 illustrates a circuit diagram of a differential amplifier core circuit according to one embodiment of the present invention. Referring to FIG. 3, the amplifier core circuit comprises three stages, namely, an input stage, an output stage, and a buffer stage. The input stage includes differential pair transistors Q1 and Q2 having emitter degeneration resistors $R_1$ and $R_2$, and corresponding loads comprising diode-connected transistors Q3 and Q4 and resistors $R_3$ and $R_4$, respectively. The output stage includes differential transistors Q9 and Q10 having emitter degeneration resistors $R_9$ and $R_{10}$, and load resistors $R_7$ and $R_8$, respectively.

The buffer stage includes emitter follower transistors Q7 and Q8 coupled between the input and output stages, differential transistors Q5 and Q6, and emitter degeneration resistors $R_5$ and $R_6$. The emitter follower transistors Q7 and Q8 provide buffering between the input and output stages, while the differential transistors Q5 and Q6 provide bias current for transistors Q7 and Q8. The tail current source of differential input transistors Q1 and Q2 is I1, the tail current source of differential pair transistors Q5 and Q6 is I2, and the tail current source of differential output transistors Q9 and Q10 is I3. A differential input voltage $V_{i+}-V_{i-}$ is applied to the bases of respective transistor pairs Q1, Q2 and Q5, Q6. The differential output voltage $(V_{o+}-V_{o-})$ is measured across the collectors of transistors Q9 and Q10, respectively.

In the following discussion, it is assumed that all transistors are the same size and all resistors (with the exception of $R_7$ and $R_8$) are of equal resistance R. Resistors $R_7$ and $R_8$ are arbitrarily assumed to be N times the value of the other resistors. In addition, the current sources I1, I2 and I3 are equal. For sake of clarity and illustration of the present invention, the base currents are ignored such that the collector current $I_C$ of a transistor is equal to the emitter current $I_E$.

When $V_{i+}=V_{i-}$, the circuit is balanced such that half of the current I1 flows through Q1 and half through Q2, half of the current I2 flows through Q5 and half through Q6, and half of the current I3 flows through Q9 and half through Q10.

Figure 1:
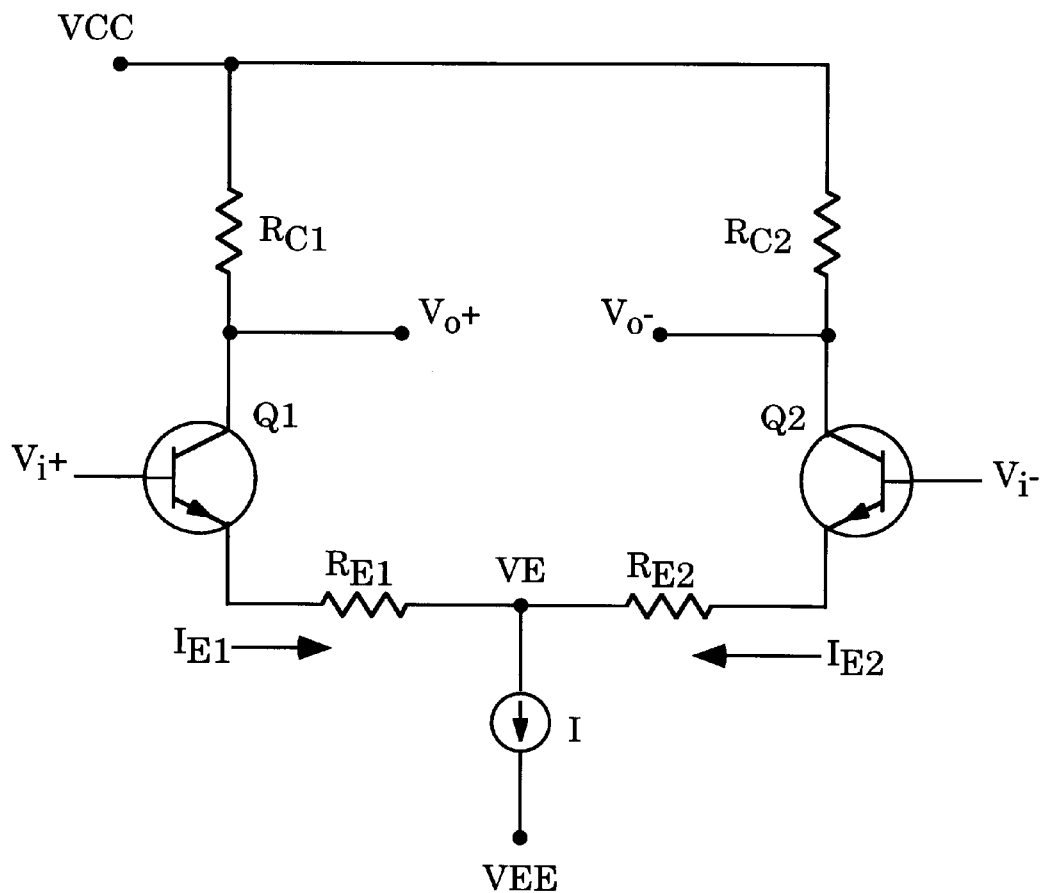
FIG. 1 illustrates a circuit diagram of a prior art differential pair amplifier circuit.
Figure 2:
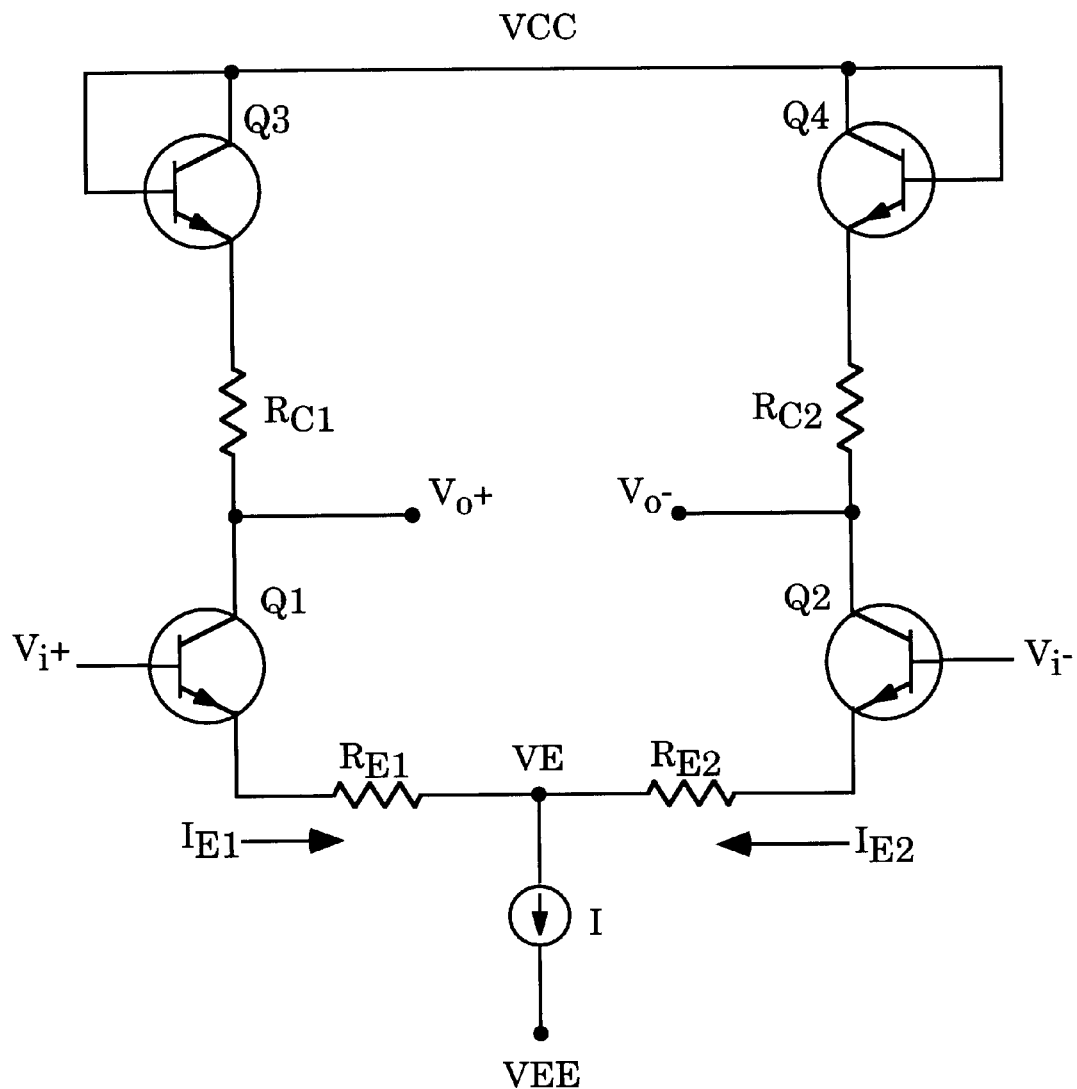
FIG. 2 illustrates a prior art technique for linearizing the characteristics of the differential pair amplifier circuit of FIG. 1.

Differential input transistors Q1 and Q2, diode-connected transistors Q3 and Q4, emitter degeneration resistors $R_1$ and $R_2$, and load resistors $R_3$ and $R_4$ are coupled such that the voltage gain from the inputs $V_{i+}$ and $V_{i-}$ to the corresponding bases of emitter followers Q7 and Q8 is unity (and 180° out of phase). As described, the transfer characteristic is linear because there are the same numbers of p-n junctions and the same resistance in the load circuits (Q3, $R_3$ and Q4, $R_4$) as in the emitter circuits (Q1, $R_1$ and Q2, $R_2$). (See FIG. 2 and the description thereof.) As such, the differential voltage $(V_{A1}-V_{A2})$ between the bases of transistors Q7 (Node A1) and Q8 (Node A2) is:

$$V_{A1}-V_{A2}=-(V_{i+}-V_{i-}).$$

The voltages at nodes C1 and C2 are:

$$V_{C1}=V_{A1}-VBE_7-VBE_9$$

$$V_{C2}=V_{A2}-VBE_8-VBE_{10}.$$

The difference in voltage between nodes C1 and C2 $(V_{C1}-V_{C2})$ is:

$$V_{C1}-V_{C2}=(V_{A1}-VBE_7-VBE_9)-(V_{A2}-VBE_8-VBE_{10})$$

or:

$$V_{C1}-V_{C2}=(V_{A1}-V_{A2})-(VBE_7-VBE_8)+(VBE_{10}-VBE_9).$$

But:

$$V_{A1}-V_{A2}=-(V_{i+}-V_{i-}),$$

so:

$$V_{C1}-V_{C2}=-((V_{i+}-V_{i-})+(VBE_7-VBE_8)-(VBE_{10}-VBE_9))$$

Note that to the extent that $VBE_7=VBE_8$ and $VBE_9=VBE_{10}$, then $V_{C1}-V_{C2}=-(V_{i+}-V_{i-})$. Also note that to the extent that $(VBE_7-VBE_8)=(VBE_{10}-VBE_9)$, then $V_{C1}-V_{C2}=-(V_{i+}-V_{i-})$.

With a zero differential input $(V_{i+}=V_{i-})$, the currents in all transistors are equal, so that the VBEs are all equal, referred to hereafter as $VBE_0$. When a positive differential input $(V_{i+}>V_{i-})$ is provided to the amplifier core, the current in transistors Q1, Q6, Q7 and Q10 increases and the current in transistors Q2, Q6, Q8 and Q9 decreases. The VBE of transistor Q7 increases because of the increased current therein, so that:

$$VBE_7=VBE_0+\Delta VBE_7$$

The VBE of transistor Q8 decreases because of the decreased current therein, so that:

$$VBE_8=VBE_0-\Delta VBE_8$$

The differential voltage between nodes B1 and B2 $(V_{B1}-V_{B2})$ will be:

$$V_{B1}-V_{B2}=V_{A1}-(VBE_0+\Delta VBE_7)-V_{A2}+(VBE_0-\Delta VBE_8),$$

or:

$$V_{B1}-V_{B2}=-(V_{i+}-V_{i-})-(\Delta VBE_7+\Delta VBE_8).$$

The VBE of transistor Q9 decreases because of the decreased current therein, so that:

$$VBE_9=VBE_0-\Delta VBE_9.$$

The VBE of transistor Q10 increases because of the increased current therein, so that:

$$VBE_{10}=VBE_0+\Delta VBE_{10}.$$

The differential voltage between nodes C1 and C2 $(V_{C1}-V_{C2})$ will be:

$$V_{C1}-V_{C2}=V_{B1}-(VBE_0-\Delta VBE_9)-V_{B2}+(VBE_0+\Delta VBE_{10}),$$

or:

$$V_{C1}-V_{C2}=-(V_{i+}-V_{i-})-(\Delta VBE_7+\Delta VBE_8)+(\Delta VBE_9+\Delta VBE_{10}).$$

In order to linearize the input/output characteristics of the differential amplifier circuit of FIG. 3, the quantity ($\Delta VBE_7 + \Delta VBE_8$) is made equal to the quantity ($\Delta VBE_9 + \Delta VBE_{10}$). This is accomplished by setting the current (IQ5–IQ6) of transistors Q5 and Q6, with ($V_{i+} - V_{i-}$), equal to the desired output current (IQ10–IQ9) of transistors Q10 and Q9. In short, since IQ5 and IQ6 bias emitter followers Q8 and Q7, respectively, a $\Delta VBE$ is created that is equal to and opposite to that in transistors Q9 and Q10. The differential voltage at the emitters of transistors Q8 and Q7 is VIN+$\Delta VBE$. The differential voltage at the emitters of transistors Q10 and Q9 is then (VIN+$\Delta VBE$)–$\Delta VBE$=VIN. The effect of the correction is to make the differential signal at the emitters of transistors Q9 and Q10 equal to the voltage at the bases of emitter followers Q7 and Q8, thereby eliminating the nonlinear effects of $\Delta VBE$.

Thus, the output of the amplifier core circuit:

$$V_{o+} - V_{o-} = N((V_{i+} - V_{i-}) + (\Delta VBE_7 + \Delta VBE_8) - (\Delta VBE_9 + \Delta VBE_{10})),$$

can be reduced to:

$$V_{o+} - V_{o-} = N(V_{i+} - V_{i-}),$$

where N does not need to be a whole number, and may be substantially above 1 as desired without limiting the headroom of the amplifier output, even by a single p-n junction voltage drop.

In the embodiment herein before described, all transistors were the same size and all resistors except $R_7$ and $R_8$ were the same size. This however is not a limitation of the invention. As an example, transistors Q9 and Q10 may optionally be made twice as large as transistors Q7 and Q8, and the current source I3 made to provide twice the current of current sources I1 and I2, allowing resistors $R_9$, $R_{10}$, $R_7$, and $R_8$ to be halved in value over that of the prior art embodiment to lower the output impedance of the amplifier.

The high-speed signal and the linearization correction signal reach the bases and emitters of Q7 and Q8 at the same time; therefore, there is no loss of bandwidth using the correction technique of the present invention.

It is important to note that emitter followers Q7 and Q8 must be biased with sufficient pull-down current so that the emitters will follow fast negative slewing signals at their bases. Differential pair transistors Q5 and Q6 steers more current into the emitter follower going down in voltage (when it needs it) and reduces the current in the emitter follower going up in voltage. This results in a significant current savings since the tail current for the degenerated differential pair transistors Q5 and Q6 can be less than the total current that would be required to bias emitter followers Q7 and Q8 with fixed pull-down currents. It is to be further noted that although the differential amplifier core circuit of FIG. 3 is shown and described using n-p-n transistors, the same result can be accomplished using p-n-p transistors.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A circuit in a differential amplifier circuit having input transistors coupled to input terminals and load circuits, and output transistors coupled to output terminals, the circuit comprising:

a pair of first transistors each having a base coupled to the corresponding input terminal, a collector, and an emitter coupled to a common terminal through a resistor of a pair of first resistors; and a pair of second transistors each having a base coupled to a collector of the corresponding input transistor, a collector coupled to a power supply terminal, and an emitter coupled to a base of the corresponding output transistor and the corresponding collector of the first transistor.

2. The circuit of claim 1 wherein each resistor in the pair of first resistors is equal in value.

3. The circuit of claim 1 wherein transistors of the first and second pairs of transistors are of a first conductivity type.

4. The circuit of claim 1 wherein transistors of the first and second pairs of transistors are n-p-n transistors.

5. The circuit of claim 1 wherein a differential current flowing through the pair of second transistors is equal to the differential current flowing through the output transistors.

6. The circuit of claim 1 further comprising:

a pair of third transistors each having a base, a collector coupled to its respective base and the power supply terminal, and an emitter coupled to the corresponding base of the second transistor through a respective resistor of a second pair of resistors.

7. A differential amplifier core circuit having input terminals and output terminals, comprising:

a pair of input transistors each having a base coupled to the respective input terminal, a collector, and an emitter coupled to a common terminal through a respective resistor of a pair of first resistors;

a pair of load circuits coupled between the collectors of the input transistors, respectively, and a power supply terminal;

a pair of second transistors each having a base coupled to the respective collector of the input transistor, a collector coupled to the power supply terminal, and an emitter;

a pair of third transistors each having a base coupled to the respective input terminal, a collector coupled to the respective emitter of the second transistor, and an emitter coupled to the common terminal through a respective resistor of a pair of second resistors; and a pair of output transistors each having a base coupled to the respective emitter of the second transistor, a collector coupled to the respective output terminal, and to the power supply terminal through a respective resistor of a pair of third resistors, and an emitter coupled to the common terminal through a respective resistor of a pair of fourth resistors.

8. The differential amplifier circuit of claim 7 wherein the load circuits comprise:

a pair of fifth transistors each having a base, a collector coupled to its respective base and the power supply terminal, and an emitter coupled to the respective collector of the input transistor through a respective resistor of a pair of fifth resistors.

9. The differential amplifier circuit of claim 8 wherein each resistor in the pair of first, second, third, fourth, and fifth resistors is equal in value.

10. The differential amplifier circuit of claim 8 wherein the pair of first, second, fourth, and fifth resistors are equal in value.

11. The differential amplifier circuit of claim 8 wherein the pair of third resistors is a predetermined number of times greater than each of the pair of first, second, fourth, and fifth resistors.

12. The differential amplifier circuit of claim 8 wherein transistors of the pair of input, second, third, output, and fifth transistors are of a first conductivity type.

13. The differential amplifier circuit of claim 8 wherein transistors of the pair of input, second, third, output, and fifth transistors are n-p-n transistors.

14. The differential amplifier circuit of claim 7 wherein a first differential current flowing through the pair of second transistors is equal to a second differential current flowing through the pair of output transistors.

15. The differential amplifier circuit of claim 7 wherein a first current source is coupled between the pair of first resistors and the common terminal, a second current source is coupled between the pair of second resistors and the common terminal, and a third current source is coupled between the pair of fourth resistors and the common terminal.

16. A differential amplifier circuit, comprising:
   an input stage including a pair of input transistors each having a base coupled to a respective one of input terminals, a collector coupled to a power supply terminal through a respective one of load circuits and an emitter coupled to a second power supply terminal;
   an output stage including output transistors each having a base, a collector coupled to a respective one of output terminals and to the power supply terminal through a respective one of a pair of first resistors, and an emitter coupled to the second power supply terminal through a respective one of a pair of second resistors; and
   a buffer stage coupled between the input terminals and the collectors of the input transistors of the input stage, and the bases of the output transistors of the output stage.

17. The differential amplifier circuit of claim 16 wherein the buffer stage comprises:
   a pair of first transistors each having a base coupled to the corresponding input terminal, a collector, and an emitter coupled to the second power supply terminal through a respective one of a pair of third resistors; and
   a pair of second transistors each having a base coupled to the collector of the corresponding input transistor, a collector coupled the power supply terminal, and an emitter coupled to the base of the corresponding output transistor and the collector of the corresponding first transistor.

18. The circuit of claim 17 wherein a first differential current flowing through the pair of second transistors is equal to a second differential current flowing through the output transistors.

19. A method of linearizing the input/output characteristics of a differential amplifier circuit having input transistors coupled to input terminals and output transistors coupled to output terminals, the method comprising:
   providing first and second terminals;
   providing a pair of first, second, and third transistors each having a base, a collector, and an emitter;
   for each transistor in a pair of transistors,
      coupling the base and collector of the first transistor together and to the first terminal;
      coupling the emitter of the first transistor to the respective input transistor through a respective resistor in a pair of first resistors;
      coupling the base of the second transistor to the respective input transistor;
      coupling the collector of the second transistor to the first terminal;
      coupling the emitter of the second transistor to the respective output transistor and to the collector of the third transistor;
      coupling the base of the third transistor to the respective input terminal; and
      coupling the emitter of the third transistor to the second terminal through a respective resistor in a pair of second resistors.

20. The method of claim 19 further comprising setting a first differential current flowing through the pair of second transistors equal to a second differential current flowing through the output transistors.

21. The circuit of claim 1 wherein a current source is coupled between the common terminal and a second power supply terminal.

22. The circuit of claim 1 wherein the pair of first transistors and the pair of second transistors offset non-linearity introduced by the output stage.

23. The differential amplifier circuit of claim 16 wherein said buffer stage to reduce any non-linearity introduced by the output stage.

24. The differential amplifier circuit of claim 17 wherein said transistors are n-p-n transistors.

25. The differential amplifier circuit of claim 17 wherein each resistor in the pair of first, second, and third resistors are equal in value.

26. The differential amplifier circuit of claim 17 wherein the pair of first resistors is a predetermined number of times greater in value than the pair of second resistors.

27. The differential amplifier circuit of claim 17 wherein each emitter of the pair of input transistors is coupled to the second power supply terminal through a respective one of a pair of fourth resistors.

28. The differential amplifier circuit of claim 27 wherein the load circuits comprise a pair of third transistors each having a base, a collector coupled to its respective base and the power supply terminal, and an emitter coupled to the corresponding base of the second transistor through a respective one of a fifth pair of resistors.

29. The differential amplifier circuit of claim 27 wherein a first current source is coupled between a first common connection of the pair of second resistors and the second power supply terminal, a second current source is coupled between a second common connection of the pair of third resistors and the second power supply terminal, and a third current source is coupled between a third common connection of the pair of fourth resistors and the second power supply terminal.

* * * * *